United States Patent
Waters

(10) Patent No.: US 12,003,237 B2
(45) Date of Patent: Jun. 4, 2024

(54) METHODS AND APPARATUS FOR ARC REDUCTION IN POWER DELIVERY SYSTEMS

(71) Applicant: Texas Instruments Incorporated, Dallas, TX (US)

(72) Inventor: Deric Wayne Waters, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 127 days.

(21) Appl. No.: 17/587,713

(22) Filed: Jan. 28, 2022

(65) Prior Publication Data

US 2023/0246645 A1    Aug. 3, 2023

(51) Int. Cl.
*H02J 7/00* (2006.01)
*H03K 19/003* (2006.01)

(52) U.S. Cl.
CPC .............................. *H03K 19/00346* (2013.01)

(58) Field of Classification Search
CPC ................................................ H03K 19/00346
See application file for complete search history.

(56) References Cited

U.S. PATENT DOCUMENTS

| | | | |
|---|---|---|---|
| 7,391,241 B2 | 6/2008 | Rajasekhar et al. | |
| 10,063,159 B1 * | 8/2018 | Kong | H03K 5/1252 |
| 10,910,822 B2 * | 2/2021 | Ramachandran | H02J 7/345 |
| 10,910,954 B1 * | 2/2021 | Shah | H01R 24/60 |
| 2018/0018012 A1 * | 1/2018 | Konnail | B60R 16/03 |
| 2020/0083725 A1 * | 3/2020 | Singh | H02J 7/0036 |

* cited by examiner

*Primary Examiner* — Kurtis R Bahr
(74) *Attorney, Agent, or Firm* — Michelle F. Murray; Frank D. Cimino

(57) ABSTRACT

An example apparatus includes: a switch having a first current terminal, a second current terminal and a control terminal, the first current terminal adapted to be coupled to a first capacitor, the second current terminal adapted to be coupled to a second capacitor; a comparator having a comparator input and a comparator output, the comparator input coupled to a configuration terminal; a deglitch circuit having a deglitch input and a deglitch output, the deglitch input coupled to the comparator output, the deglitch circuit having a deglitch duration between a first duration and a second duration; and a universal serial bus (USB) controller having a controller output and a controller input, the controller output coupled to the control terminal, the controller input coupled to the deglitch output.

21 Claims, 5 Drawing Sheets

METHODS AND APPARATUS FOR ARC REDUCTION IN POWER DELIVERY SYSTEMS

TECHNICAL FIELD

This description relates generally to power delivery systems, and more particularly to methods and apparatus for arc reduction in power delivery systems.

BACKGROUND

Universal serial bus (USB) communication typically supplied power from a source device to a sink device through a USB connector (e.g., an electronic connector including wires to electrically couple a first end to a second end). Some sink devices, include loads to which power is supplied. The connection between the source device and the sink device may be physically disconnected (e.g., the USB connector that electrically couples the source device to the sink device is removed).

SUMMARY

For methods and apparatus of arc reduction in power delivery systems, an example apparatus includes a switch having a first current terminal, a second current terminal and a control terminal, the first current terminal adapted to be coupled to a first capacitor, the second current terminal adapted to be coupled to a second capacitor; a comparator having a comparator input and a comparator output, the comparator input coupled to a configuration terminal; a deglitch circuit having a deglitch input and a deglitch output, the deglitch input coupled to the comparator output, the deglitch circuit having a deglitch duration between a first duration and a second duration; and a universal serial bus (USB) controller having a controller output and a controller input, the controller output coupled to the control terminal, the controller input coupled to the deglitch output.

DETAILED DESCRIPTION

Figure 1:
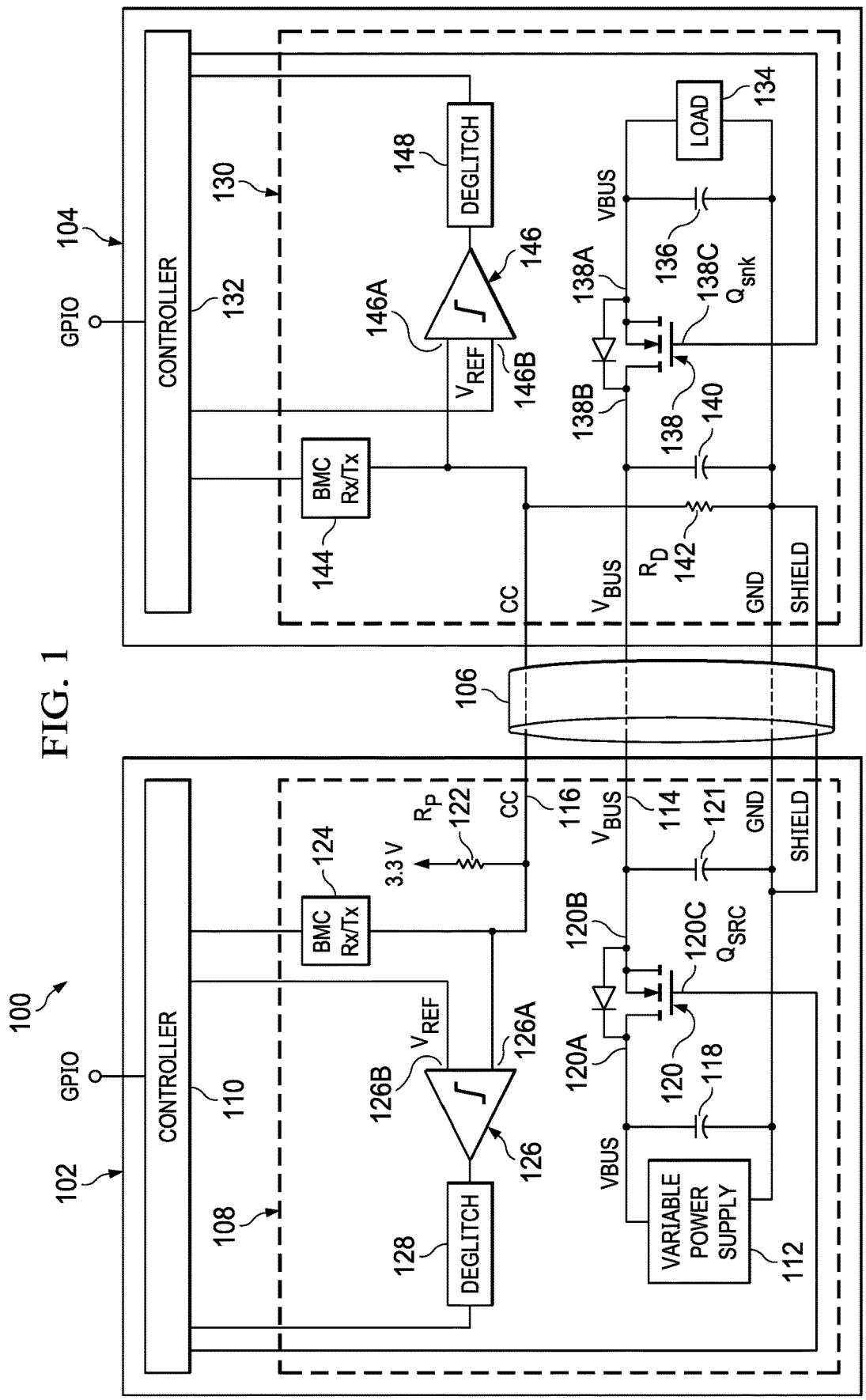
FIG. 1 is a schematic diagram of an example USB communication system including an example source device, an example sink device, and an example USB connector.

The drawings are not necessarily to scale. Generally, the same reference numbers in the drawing(s) and this description refer to the same or like parts. Although the drawings show layers and regions with clean lines and boundaries, some or all of these lines and/or boundaries may be idealized. In reality, the boundaries and/or lines may be unobservable, blended and/or irregular.

Universal serial bus (USB) communication typically includes a method of power delivery wherein a source device supplies power to a sink device through a USB connector (e.g., an electronic connector including wires to electrically couple a first end to a second end). USB power delivery typically involves the source device and sink device coupled through a configuration channel (CC), a voltage BUS (Vbus), and a common potential (e.g., ground). The configuration channel is configured to allow the source device to detect the presence of the sink device and communicate with the sink device. The voltage BUS is configured to supply power from the source device to the sink device.

The sink device may be configured to determine the presence of the source device based on the configuration channel. For example, the source device may compare the configuration channel voltage to a first threshold voltage to generate a logic "1" when the sink is present and a logic "0" when the sink is not present. Similarly, the sink device may compare the configuration channel voltage to a second threshold voltage to generate a logic "1" when the source is present and a logic "0" when the source is not present.

A baseband management controller (BMC) included in the source device and/or the sink device may drive the configuration channel to transmit a plurality of communication messages. For example, the BMC may temporarily drive the configuration channel to a logic "0" or "1" to configure the source device to supply a specific magnitude of power to the sink device.

The USB voltage is configured to deliver power from a power source included in the source device to a load included in the sink device. The common potential is configured to be coupled to the source device and the sink device, such that the common potential may be configured to shield the configuration channel and the USB voltage. The source device may include a variable power supply configured as the power source for the sink device as a result of the source device being coupled to the sink device. A magnitude of the power being supplied by the source device may be determined based on an exchange of data between the source device and the sink device across the configuration channel. The exchange of data between the source device and the sink device may be referred to as a USB power delivery (USB-PD) transmission. The USB-PD transmission is included on the configuration channel of the USB connector, such that a driver included in the source device and/or the sink device may be used to generate the USB-PD transmissions on the configuration channel.

The connection between the source device and the sink device may be terminated, at any point, as a result of a physical disconnect of the USB connector used to couple the source device to the sink device. The physical disconnection of the source device and sink device may result in a potential difference (such as a voltage difference) between the USB connector and the source device and/or the sink device that may result in an arc, which may cause irreversible damage to the source device and/or the sink device. The chances of the arc decreased as a result of reducing the difference in potential across the gap between the USB connector and the source device and/or sink device.

A source device and/or a sink device may be configured to prevent an arc by including a capacitor between the power supply and the load. The capacitor is sized to enable the USB connector to reach a safe distance before the potential across the capacitor discharges enough to cause an arc. As the magnitude of the current supplied to the sink device increases, so does the magnitude and package size of the capacitor required between the Vbus and the load. Another method for preventing an arc during physical disconnects is by measuring a difference in potential on the Vbus, such that the sink device determines a physical disconnect when the Vbus is lower than a threshold. The method of monitoring the Vbus to determine a physical disconnect requires the potential on the Vbus to change, before determining a physical disconnect.

Examples described herein include methods and apparatus for arc prevention in USB power delivery systems by monitoring the configuration channel for changes in voltages longer than a determined debounce duration. In some described examples, a comparator is placed on the configuration channel to compare the voltage of the configuration channel to a voltage reference, such that a deglitch circuit may determine a physical disconnect based on the output of the comparator over the determined deglitch duration. For example, the comparator may be coupled to a deglitch circuit configured to disable a switch as a result of a logic low or a logic high of a duration longer than the determined debounce duration compared to the voltage reference. Additionally, USB-PD messages may be included in the USB-PD transmission to determine a reduced magnitude of the power transmitted across the Vbus based on the length of the USB-PD messages. For example, a USB-PD message may indicate a magnitude of a current for which the sink device is configured to consume, such that the source device or the sink device may compare the current consumed by the sink device to a threshold to determine whether or not additional arc prevention is required. Alternatively, a device may determine additional arc prevention is required based on determining a load current and/or voltage is less than the threshold, such that no USB-PD messages are required.

FIG. 1 is a schematic diagram of an example USB system 100 including an example source device 102, an example sink device 104, and an example USB connector 106. The USB system 100 is configured to transfer power from the source device 102 to the sink device 104 through the USB connector 106. Additionally, the USB system 100 is configured to exchange data between the source device 102 and the sink device 104 through the USB connector 106.

In the example of the USB system 100 of FIG. 1, the source device 102 includes example source side circuitry 108 and an example first controller 110. The source side circuitry 108 includes an example power supply 112, an example BUS voltage (VBus) 114, an example configuration channel 116, an example first capacitor 118, an example first transistor 120, an example first resistor (Rip) 122, an example first baseband management controller (BMC) 124, an example first comparator 126, and an example first deglitch circuit 128. The source side circuitry 108 is configured to supply power from the power supply 112 to the sink device 104 through the BUS voltage 114. Additionally, the source side circuitry 108 is configured to communicate to the sink device 104 through the configuration channel 116.

In the example of the source side circuitry 108, the power supply 112 is coupled in parallel with the first capacitor 118 between the BUS voltage 114 and a common potential (e.g., ground). The power supply 112 is coupled to the BUS voltage 114 through the first transistor 120. A first current terminal 120A of the first transistor 120 is coupled to the power supply 112 and the first capacitor 118. A second current terminal 120B of the first transistor 120 is coupled to the BUS voltage 114. A gate terminal of a transistor may be referred to as a control terminal (e.g., the control terminal 120C of the first transistor 120). A source terminal or a drain terminal may be referred to as a current terminal (e.g., the first current terminal 120A of the first transistor 120 and the second current terminal 120B of the first transistor 120).

The first capacitor 118 is configured to resist sudden changes in voltage on the source device 102 side of the BUS voltage 114. For example, if the USB connector 106 is physically disconnected from the source device 102 and/or the sink device 104, the first capacitor 118 is configured to prevent the potential of the BUS voltage 114 from increasing and/or decreasing for an amount of time, such that the amount of time is of a magnitude great enough to distance the USB connector 106 from the source device 102 or sink device 104 as to prevent an arc. The first capacitor 118 may be increased in size, in order to increase the amount of time needed to prevent arcing.

The first transistor 120 is configured to allow current to flow from the first current terminal 120A to the second current terminal 120B based on a voltage of the control terminal 120C. In the example of FIG. 1, the first transistor 120 is a N-channel metal-oxide-semiconductor field-effect transistor (MOSFET). Alternatively, the first transistor 120 may be a N-channel field-effect transistor (NFET), a N-channel insulated-gate bipolar transistor (IGBT), a N-channel junction field effect transistor (JFET), or an NPN bipolar junction transistor (BJT). The first transistor 120 is configured to provide power to the BUS voltage 114 as a result of being enabled. The first transistor 120 is configured to prevent power from being supplied across the BUS voltage 114 as a result of the first transistor 120 being disabled. The first transistor 120 may be controlled, by the control terminal 120C, such that as a result of a physical disconnect being detected, the first transistor 120 may interrupt power being transferred across the BUS voltage 114. Advantageously, the first transistor 120 is configured to enable and disable power transfer across the BUS voltage 114.

The second capacitor 121 is configured to resist sudden changes in voltage on the source side circuitry 108 of the BUS voltage 114. For example, if the USB connector 106 is physically disconnected from the source device 102, the second capacitor 121 is configured to prevent the potential of the BUS voltage 114 from increasing and/or decreasing for an amount of time, such that the amount of time is of a magnitude great enough to distance the USB connector 106 from the source device 102 as to prevent an arc. The second capacitor 121 may be increased in magnitude, in order to increase the duration preventing the arc. The second capacitor 121 may be decreased in magnitude to decrease the duration preventing the arc.

In the example of the source side circuitry 108, the configuration channel 116 is coupled to the first resistor 122, the first BMC 124, and a first comparator input 126A of the first comparator 126. The first resistor 122 is coupled between a voltage source and the configuration channel 116, such configuration channel 116 may be referred to as a configuration terminal. The first comparator 126 is coupled between the configuration channel 116 and the first deglitch circuit 128.

The first resistor 122 is configured as a pull-up resistor, such that the state of the configuration channel 116 may be determined. For example, if there is no transmission on the configuration channel 116, the state of the configuration channel 116 is based on the first resistor 122 being coupled between a voltage supply (e.g., 3.3 volts) and the configuration channel 116. Alternatively, the first resistor 122 may be coupled between a current source and the configuration channel 116. Advantageously, the first resistor 122 enables the configuration channel 116 to be driven by the first BMC 124.

The first BMC 124 is configured to monitor and/or set the value of the configuration channel 116, such that transmissions from the sink device 104 are received by the first BMC 124. The first BMC 124 may be configured to transmit data to the sink device 104 across the configuration channel 116. Alternatively, the first BMC 124 may be any processing circuitry configured to receive and/or transmit data on the configuration channel 116.

The first comparator 126 is configured to compare the first comparator input 126A to a second comparator input 126B. In the example of FIG. 1, the first comparator input 126A is the voltage of the configuration channel 116. The second comparator input 126B is coupled to a reference voltage (Vref). The first comparator 126 may be configured to a reference voltage based on an expected voltage of the configuration channel 116. The first comparator 126 may be configured to determine a comparator output based on any voltage of the first comparator input 126A of the first comparator 126 above or below the voltage of the second comparator input 126B as a digital logic high (such as a value of "1") or low (such as a value of "0"). Advantageously, the first comparator 126 reduces a settling time that may be caused by a driver (e.g., the first BMC 124) on the comparator output of the first comparator 126.

In the example of FIG. 1, the first deglitch circuit 128 is configured to determine if the comparator output of the first comparator 126 indicates a physical disconnect. A deglitch input of the first deglitch circuit 128 is coupled to the comparator output of the first comparator 126. The first deglitch circuit 128 is configured to monitor the comparator output of the first comparator 126, such that a physical disconnection is determined as a result of a digital logic high of a duration longer than or equal to a determined deglitch duration. For example, the first deglitch circuit 128 may determine that a physical disconnection occurred if the comparator output of the comparator 126 is a digital high for a duration greater than the determined deglitch duration. The determined deglitch duration may be based on the probability of an arc occurring. For example, the determined deglitch time may be shortened, if the BUS voltage 114 is providing power of a magnitude greater than or equal to a threshold. Examples of deglitch circuits include deglitch circuits shown in co-assigned U.S. Pat. No. 7,391,241 (of which is incorporated by reference in their entirety). Advantageously, the first deglitch circuit 128 determines a physical disconnect based on the output of the first comparator 126 comparing the configuration channel 116 to a reference voltage.

The first controller 110 is coupled to the control terminal 120C of the first transistor 120, the first BMC 124, the second comparator input 126B of the first comparator 126, and a deglitch output of the first deglitch circuit 128. The first controller 110 is configured to control the first transistor 120 based on the first deglitch circuit 128, such that a controller input is coupled to the deglitch output of the first deglitch circuit 128 and a controller output is coupled to the control terminal 120C. For example, the first controller 110 may disable the first transistor 120 as a result of the first deglitch circuit 128 determining a physical disconnect occurred.

The first controller 110 is configured to control the first BMC 124. For example, the first controller 110 may transmit a USB-PD message to the sink device 104 as the result of controlling the first BMC 124. Alternatively, the first controller 110 may monitor the configuration channel 116 through the first BMC 124.

The first controller 110 is configured to set the second comparator input 126B of the first comparator 126, such that the voltage threshold of the first comparator 126 may be modified. Alternatively, the second comparator input 126B of the first comparator 126 may be coupled to a fixed reference voltage.

The first controller 110 may be configured to determine and/or set the determined deglitch duration of the first deglitch circuit 128. For example, the first controller 110 may set the determined deglitch duration to a reduced duration as the result of the magnitude of the power supplied by the power supply 112 being greater than a threshold. Advantageously, the ability to adjust the determined deglitch duration enables the source device 102 to reduce the potential of an arc as the result of a physical disconnect.

In the example of the USB system 100 of FIG. 1, the sink device 104 includes an example sink side circuitry 130 and a second controller 132. The sink device 104 is configured to receive power from the source device 102, such that the operations of the sink device 104 may be powered by the USB connector 106. Additionally, the source device 104 is configured to communicate with the source device 102 to determine a supply value for the power supply 112.

The sink side circuitry 130 includes the BUS voltage (VBus) 114, the configuration channel 116, an example load 134, a second capacitor 136, a second transistor 138, a third capacitor 140, a second resistor (Rd) 142, a second BMC 144, a second comparator 146, and a second deglitch circuit 148. The sink side circuitry 130 is configured to supply power to the load 134 from the power supply 112 of the source device 102 through the BUS voltage 114. Additionally, the sink side circuitry 130 is configured to communicate to the source device 102 through the configuration channel 116.

In the example of the sink side circuitry 130, the load 134 is coupled in parallel with the second capacitor 136 between the BUS voltage 114 and common potential (e.g., ground). The load 134 is coupled to the BUS voltage 114 through the second transistor 138. A first current terminal 138A of the second transistor 138 is coupled to the load 134 and the second capacitor 136. The BUS voltage 114 is coupled to a second current terminal 138B of the second transistor 138 and the third capacitor 140. The third capacitor 140 is coupled between the BUS voltage 114 and common potential (e.g., ground).

The third capacitor 136 is configured to resist sudden changes in voltage across the load 134. For example, if the USB connector 106 is physically disconnected from the sink device 104, the third capacitor 136 is configured to prevent the potential across the load 134 from increasing and/or decreasing for an amount of time, such that the amount of time is of a magnitude great enough to distance the USB connector 106 from the sink device 104 as to prevent an arc.

The third capacitor 136 may be increased in size, in order to increase the amount of time needed to prevent the arc.

The second transistor 138 is configured to allow current to flow from the first current terminal 138A to the second current terminal 138B based on a voltage of a control terminal 138C. The second transistor 138 is a N-channel MOSFET. Alternatively, the second transistor 138 may be a NFET, a N-channel IGBT, a N-channel JFET, or an NPN BJT. The second transistor 138 is configured to enable power to the load 134 as a result of being enabled. The second transistor 138 is configured to prevent power from being supplied to the load 134 as a result of the second transistor 138 being disabled. The second transistor 138 may be controlled, by the control terminal 138C, such that as a result of a physical disconnect being determined, the second transistor 138 may prevent power being supplied to the load 134. Advantageously, the second transistor 138 is configured to enable and disable power transfer to the load 134.

The fourth capacitor 140 is configured to resist sudden changes in voltage on the sink side circuitry 130 side of the BUS voltage 114. For example, if the USB connector 106 is physically disconnected from the sink device 104, the fourth capacitor 140 is configured to prevent the potential of the BUS voltage 114 from increasing and/or decreasing for an amount of time, such that the amount of time is of a magnitude great enough to distance the USB connector 106 from the sink device 104 as to prevent an arc. The fourth capacitor 140 may be increased in magnitude, in order to increase the duration preventing the arc. The fourth capacitor 140 may be decreased in magnitude to decrease the duration preventing the arc.

In the example of the sink side circuitry 130 of FIG. 1, the configuration channel 116 is coupled to the second resistor 142, the second BMC 144, and a second comparator input 146A of the second comparator 146. The second resistor 142 is coupled between the configuration channel 116 and common potential (e.g., ground). The second comparator 146 is coupled between the configuration channel 116 and the second deglitch circuit 148.

The second resistor 142 is configured as a pull-down resistor, such that the state of the configuration channel 116 may be determined based on the voltage difference between the common potential (e.g., ground) and the second resistor 142. The resistors 122 and 142 are configured as a voltage divider, such that the voltage of the configuration channel 116 may be determined. For example, if there is a physical disconnect, the state of the configuration channel 116 is based on the second resistor 142 being coupled to the common potential (e.g., ground), such that the voltage of the configuration channel 116 is the same as the common potential. Advantageously, the second resistor 142 enables the configuration channel 116 to be driven towards common potential (e.g., ground) responsive to a physical disconnect.

The second BMC 144 is configured to set the value of the configuration channel 116, such that the sink device 104 may transmit data to the source device 102. Alternatively, the second BMC 144 may be any processing circuitry (e.g., the same as the first BMC 124) configured to receive and/or transmit data on the configuration channel 116.

The second comparator 146 is configured to compare the first comparator input 146A of the second comparator 146 to a second comparator input 146B of the second comparator 146. In the example of FIG. 1, the first comparator input 146A of the second comparator 146 is the voltage of the configuration channel 116. The second comparator input 146B of the second comparator 146 is coupled to a reference voltage (Vref). The second comparator 146 may be configured to a reference voltage based on an expected voltage of a digital transmission on the configuration channel 116. The second comparator 146 may be configured to determine a comparator output based on any voltage of the first comparator input 146A of the second comparator 146 above or below the voltage of the second comparator input 126B of the second comparator 146 as a digital logic high (such as a value of "1") or low (such as a value of "0"). Advantageously, the second comparator 146 reduces a settling time that may be caused by a driver (e.g., the first BMC 124, the second BMC 144, etc.) on the comparator output of the second comparator 146.

In the example of FIG. 1, the second deglitch circuit 148 is configured to determine if the output of the second comparator 146 indicates a physical disconnect. The second deglitch circuit 148 is configured to monitor the output of the second comparator 146, such that a physical disconnection is determined as a result of a digital logic low of a duration longer than or equal to a determined deglitch duration. For example, the second deglitch circuit 148 may determine that a physical disconnection occurred if the output of the comparator 126 is a digital low for a duration greater than the determined deglitch duration. The determined deglitch duration may be based on the probability of an arc occurring. For example, the determined deglitch duration may be shortened, if the BUS voltage 114 is providing power of a magnitude greater than or equal to a threshold. Advantageously, the second deglitch circuit 148 determines a physical disconnect based on the output of the second comparator 146 comparing the configuration channel 116 to a reference voltage.

The second controller 132 is coupled to the control terminal 138C of the second transistor 138, the second BMC 144, the second comparator input 146B of the second comparator 146, and the second deglitch circuit 148. The second controller 132 is configured to control the second transistor 138 based on the second deglitch circuit 148. For example, the controller may disable the second transistor 138 as a result of the second deglitch circuit 148 determining a physical disconnect occurred.

The second controller 132 is configured to control the second BMC 144. For example, the second controller 132 may transmit a USB-PD message to the source device 102 as the result of controlling the second BMC 144. Alternatively, the second controller 132 may monitor the configuration channel 116 through the second BMC 144.

The second controller 132 is configured to set the second comparator input 146B of the second comparator 146, such that the voltage threshold of the second comparator 146 may be modified. Alternatively, the second comparator input 146B of the second comparator 146 may be coupled to a fixed reference voltage.

The second controller 132 may be configured to determine and/or set the determined deglitch duration of the second deglitch circuit 148. For example, the second controller 132 may set the determined deglitch time to a reduced duration as the result of the magnitude of the power supplied to the load 134 being greater than a threshold. Advantageously, the ability to adjust the determined deglitch duration enables the sink device 104 to reduce the potential of an arc as the result of a physical disconnect.

In example operation, the source device 102 communicates with the sink device 104 to determine a magnitude of the power supply 112 responsive to the source device 102 and/or sink device 104 determining a connection (such as connecting the source side circuitry 108 to the sink side circuitry 130 through the USB connector 106). The source device 102 and sink device 104 may set the determined deglitch duration based on the magnitude of power to be transmitted across the BUS voltage 114. The source device 102 configures the power supply 112 to supply power to the load 134, through the BUS voltage 114, by setting the control terminal 120C to enable the first transistor 120. The sink device 104 configures the load 134 to receive power, from the BUS voltage 114, by setting the control terminal 138C of the second transistor 138.

In example operation, the configuration channel 116 may be implemented as a method of transferring data between the source side circuitry 108 and the sink side circuitry 130. The comparators 126 and 146 compare the configuration channel 116 to the voltage references. The deglitch circuits 128 and 148 monitor the output of the comparators 126 and 146 to determine if there is a physical disconnect based on the determined deglitch duration.

In example operation, a physical disconnect of the source device 102 and the sink device 104 is determined as a result of the deglitch circuits 128 and/or 148 determine that the output of the comparators 126 and/or 146 are at a logic level for a duration greater than or equal to the determined deglitch duration. The source device 102 may disable power transfer to the BUS voltage 114 by disabling the first transistor 120 as a result of the first deglitch circuit 128 determining a physical disconnect. The sink device 104 may disable power to the load by disabling the second transistor 138 as a result of the second deglitch circuit 148 determining a physical disconnect. Advantageously, the determined deglitch duration may be set to prevent an arc as a result of determining a physical disconnect. Advantageously, the transistors 120 and 138 enable the power supply 112 and/or the load 134 to be disconnected as a result of determining a physical disconnect.

Figure 2:
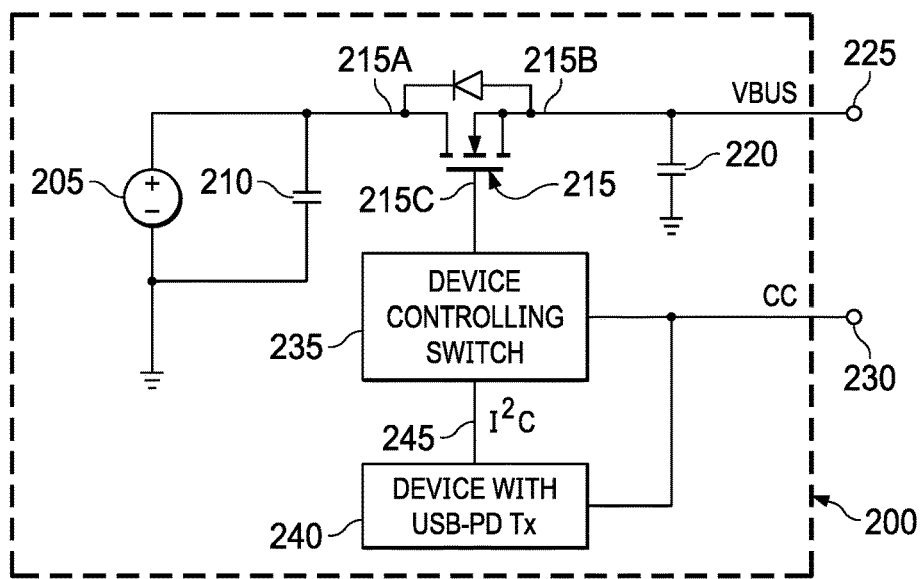
FIG. 2 is a schematic diagram of an example source device configured as a multi-chip module.

FIG. 2 is a schematic diagram of an example source device 200 configured as a multi-chip module. The source device 200 may be implemented as the source side circuitry 108 of FIG. 1. In the example of FIG. 2, the source device 200 includes an example power supply 205, an example first capacitor 210, an example transistor 215, a second capacitor 220, an example BUS voltage (VBUS) 225, an example configuration channel (CC) 230, an example first device 235, a second device 240, and an example inter-integrated circuit (I2C) channel 245.

In the example of FIG. 2, the power supply 205 and the first capacitor 210 are coupled in parallel between a first current terminal 215A of the transistor 215 and a common potential (e.g., ground). A second current terminal 215B of the transistor 215 is coupled to the second capacitor 220 and the BUS voltage 225. The second capacitor 220 is coupled between the BUS voltage 225 and a common potential (e.g., ground). The configuration channel 230 is coupled to the devices 235 and 240. A control terminal 215C of the transistor 215 is coupled to the first device 235. The first device 235 is coupled to the second device 240 by the I2C channel 245.

In the example of FIG. 2, the power supply 205 is configured to supply power to the BUS voltage 225. The power supply 205 may be set based on the power requirements of a sink device (e.g., the sink side circuitry 130 of FIG. 1) coupled to the BUS voltage 225.

The first capacitor 210 is configured to prevent sudden voltage changes (e.g., a surge or arc) across the power supply 205. A magnitude of the first capacitor 210 is determined based on the specifications of the power supply 205, such that the first capacitor 210 may prevent sudden voltage changes which may result in damage to the power supply 205. Additionally, the magnitude of the first capacitor 210 may be determined based on the physical packages size, such that applications with limited package sizes may implement a decreased magnitude of the first capacitor 210.

The transistor 215 is configured to allow current to flow from the first current terminal 215A to the second current terminal 215B based on the control terminal 215C. The transistor 215 is a N-channel MOSFET. Alternatively, the transistor 215 may be a NFET, a N-channel IGBT, a N-channel JFET, or an NPN BJT. The transistor 215 is configured to enable power to the BUS voltage 225 as a result of being enabled. The transistor 215 is configured to prevent power from being supplied to the BUS voltage 225 as a result of the transistor 215 being disabled. The transistor 215 may be controlled, by the control terminal 215C, such that as a result of a physical disconnect being determined, the transistor 215 may prevent power being supplied to the BUS voltage 225. Advantageously, the transistor 215 is configured to enable and disable power transfer to a device (e.g., the sink side circuitry 130) coupled to the BUS voltage 225.

The second capacitor 220 is configured to resist sudden changes (e.g., a surge, an arc, etc.) in voltage on the BUS voltage 225. For example, if the source device 200 is physically disconnected from another device (e.g., the sink side circuitry 130), the second capacitor 220 is configured to prevent the potential of the BUS voltage 225 from increasing and/or decreasing for an amount of time, such that the amount of time is of a magnitude great enough to distance a connector (e.g., the USB connector 106 of FIG. 1) from the source device 200 as to prevent an arc. The second capacitor 220 may be increased in size, in order to increase the duration to preventing the arc. The second capacitor 220 may be decreased in size, in order to decrease the duration preventing the arc.

In the example of FIG. 2, the first device 235 is configured to control the transistor 215 by setting or clearing the control terminal 215C of the transistor 215. The first device 235 may include the first resistor 122 of FIG. 1, the first BMC 124 of FIG. 1, the first comparator 126 of FIG. 1, and/or the first deglitch circuit 128 of FIG. 1. The first device 235 may be configured to set a deglitch time of the first deglitch circuit 128. The first device 235 may be configured to determine a physical disconnect. The first device 235 is configured to communicate by inter-integrated circuit (I2C) protocol to the second device 240 via the I2C channel 245. The first device 235 is configured to disable the transistor 215 as a result of determining a physical disconnect on the configuration channel 230.

In the example of FIG. 2, the second device 240 may include the first resistor 122, the first BMC 124, the first comparator 126, and/or the first deglitch circuit 128. The second device 240 may be referred to as a controller. The second device 240 is configured to communicate with the first device 235 by I2C protocol via the I2C channel 245. The second device 240 may be configured to determine the reference voltage implemented by the first comparator 126. The second device 240 may be configured to determine the deglitch duration implemented by the first deglitch circuit 128. The second device 240 may communicate by the I2C channel 245 to set the reference voltage, determined deglitch time, and/or the control terminal 215C of the transistor 215. Alternatively, the configuration channel 230 may be coupled to the second device 240 through the first device 235.

In example operation, the source device 200 may be coupled to a sink device (e.g., the sink device 104 of FIG. 1). The second device 240 may transmit data on the configuration channel 230 to determine the magnitude of the power supply 205, such messages may be referred to as USB-power delivery (USB-PD) messages. The second device 240 determines the determined deglitch duration based on the USB-PD messages received from the coupled device. The second device 240 sets the determined deglitch duration on the first device 235 though a transmission on the I2C channel 245.

In example operation, the first device 235 receives the determined deglitch duration from the second device 240 by the I2C channel 245. The first device 235 may implement the determined deglitch time and reference voltage before enabling the transistor 215. The first device 235 may disable the transistor 215 as a result of determining a physical disconnect and/or receiving a message from the second device 240 to disable the transistor 215. The first device 235 may transmit a message to the second device 240 through the I2C channel 245 as a result of determining a physical disconnect. Advantageously, the devices 235 and 240 may be implemented as a separate chip within a single package.

Figure 3:
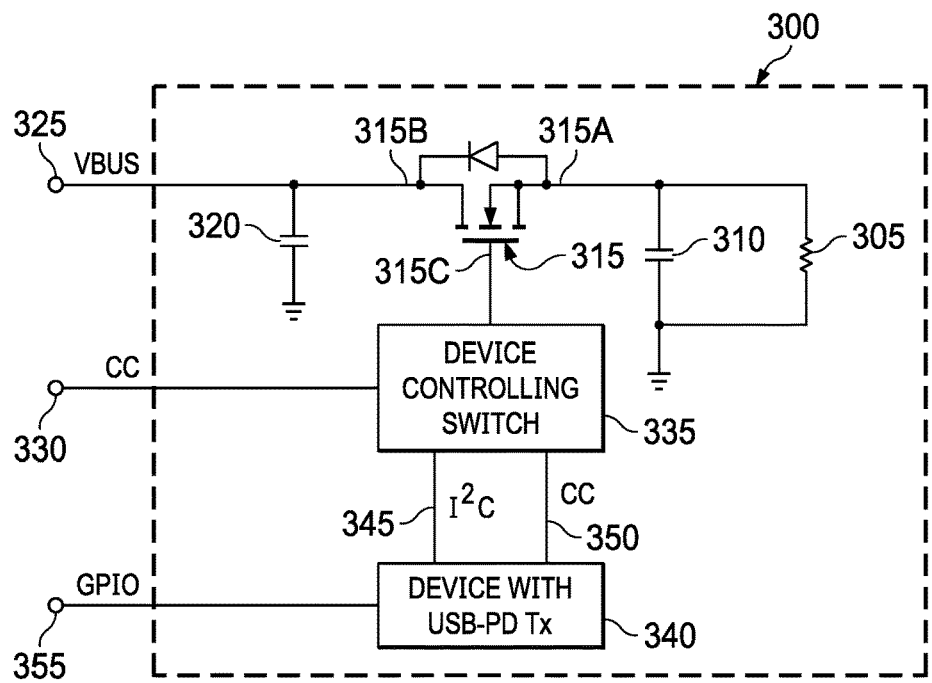
FIG. 3 is a schematic diagram of an example sink device configured as a multi-chip module.

FIG. 3 is a schematic diagram of an example sink device 300 configured as a multi-chip module. The sink device 300 may be implemented as the sink side circuitry 130 of FIG. 1. In the example of FIG. 3, the sink device 300 includes an example resistor 305, an example first capacitor 310, an example transistor 315, a second capacitor 320, an example BUS voltage (VBUS) 325, an example first configuration channel (CC) 330, an example first device 335, a second device 340, an example inter-integrated circuit (I2C) channel 345, and a second configuration channel 350.

In the example of FIG. 3, the resistor 305 and the first capacitor 310 are coupled in parallel between a first current terminal 315A and a common potential (e.g., ground). A second current terminal 315B is coupled to the second capacitor 320 and the BUS voltage 325. The second capacitor 320 is coupled between the BUS voltage 325 and a common potential (e.g., ground). The first configuration channel 330 is coupled to the first device 335. A control terminal 315C is coupled to the first device 335. The first device 335 is coupled to the second device 340 by the I2C channel 345 and the second configuration channel 350.

In the example of FIG. 3, the resistor 305 is configured to represent a load of the sink device 300, which the BUS voltage 325 is supplying power to. The resistor 305 may be a load caused by a peripheral device (e.g., a sensor, a storage device, processing circuitry, etc.). The resistor 305 may be replaced with the load 134 of FIG. 1.

The first capacitor 310 is configured to prevent sudden voltage changes (e.g., a surge or arc) across the resistor 305. A magnitude of the first capacitor 310 is determined based on the power supplied to the resistor 305, such that the first capacitor 310 may prevent sudden voltage changes which may result in damage to the resistor 305. Additionally, the magnitude of the first capacitor 310 may be determined based on the physical packages size, such that applications with limited package sizes may implement a decreased magnitude of the first capacitor 310.

The transistor 315 is configured to allow current to flow from the first current terminal 315A of the transistor 315 to the second current terminal 315B of the transistor 315 based on the control terminal 315C of the transistor 315. The transistor 315 is a N-channel MOSFET. Alternatively, the transistor 315 may be a NFET, a N-channel IGBT, a N-channel JFET, or an NPN BJT. The transistor 315 is configured to the BUS voltage 325 to deliver power to the resistor 305 as a result of being enabled. The transistor 315 is configured to prevent power from being supplied by the BUS voltage 325 to the resistor 305 as a result of the transistor 315 being disabled. The transistor 315 may be controlled, by the control terminal 315C, such that as a result of a physical disconnect being determined, the transistor 315 may prevent power from being supplied by the BUS voltage 325 to the resistor 305. Advantageously, the transistor 315 is configured to enable and disable power transfer from the BUS voltage 325 to a load (e.g., the load 134, the resistor 305).

The second capacitor 320 is configured to resist sudden changes (e.g., a surge, an arc, etc.) in voltage on the BUS voltage 325. For example, if the sink device 300 is physically disconnected from another device (e.g., the source side circuitry 108), the second capacitor 320 is configured to prevent the potential of the BUS voltage 325 from increasing and/or decreasing for an amount of time, such that the amount of time is of a magnitude great enough to distance a connector (e.g., the USB connector 106 of FIG. 1) from the sink device 300 as to prevent an arc. The second capacitor 320 may be increased in size, in order to increase the duration to preventing the arc. The second capacitor 320 may be decreased in size, in order to decrease the duration preventing the arc.

In the example of FIG. 3, the first device 335 is configured to control the transistor 315 by setting or clearing the control terminal 315C of the transistor 315. The first device 335 may include the second resistor 142 of FIG. 1, the second BMC 144 of FIG. 1, the second comparator 146 of FIG. 1, and/or the second deglitch circuit 148 of FIG. 1. The first device 335 may be configured to set a determined deglitch duration of the second deglitch circuit 148. The first device 335 may be configured to include additional circuitry to switch between a first deglitch value corresponding to a first deglitch duration and a second deglitch value corresponding to a second deglitch value. For example, the first device 335 may enable the first deglitch value for a determined duration before switching to the second deglitch value, such that the determined duration may be approximately a duration of a USB-PD message transmitted by the second device 340. Advantageously, the second device 340 can configure the first device 335 to begin using the second deglitch value using the I2C interface such that during its data transmission the second deglitch value is in use. Advantageously, the first device 335 may modify the deglitch value upon receiving the data transmission. The first device 335 may be configured to determine a physical disconnect by monitoring the first configuration channel 330. The first device 335 is configured to communicate by inter-integrated circuit (I2C) protocol to the second device 340 via the I2C channel 345. The first device 335 may be configured to couple the first configuration channel 330 to the second configuration channel 350. The first device 335 is configured to disable the transistor 315 as a result of determining a physical disconnect on the first configuration channel 330.

In the example of FIG. 3, the second device 340 may include the second resistor 142, the second BMC 144, the second comparator 146, and/or the second deglitch circuit 148. The second device 340 may be referred to as a controller. The second device 240 is configured to communicate with the first device 335 by I2C protocol via the I2C channel 345. Alternatively, the devices 335 and 340 may communicate through the second configuration channel 350. The second device 340 may be configured to determine the reference voltage implemented by the second comparator 146. The second device 340 may be configured to determine the deglitch duration implemented by the second deglitch circuit 148. The second device 340 may communicate by the I2C channel 345 to set the reference voltage, determined deglitch time, and/or the control terminal 315C of the transistor 315. Alternatively, the first configuration channel 330 may be coupled to the second device 340 through the first device 335. The second device 340 may be configured to include an example general-purpose input output (GPIO) pin 355. The GPIO pin 355 is configured to be coupled to a controller (e.g., a microcontroller, the first controller 110 and 132 of FIG. 1, etc.), such that the GPIO pin 355 may be asserted. The GPIO pin 355 is configured to increase (to reduce the load) the value of the first resistor 305 based on being asserted. For example, the second device 340 may assert the GPIO 355 as the result of the magnitude of the power transmitted on the BUS voltage 325 is greater than a threshold. Alternatively, the second device 340 may assert the GPIO 355 during the transmission of a USB-PD message longer than a certain duration.

In example operation, the sink device 300 may be coupled to a source device (e.g., the source device 102 of FIG. 1, the source device 200 of FIG. 2). The second device 340 may transmit data on the configuration channels 330 and 350 to set the magnitude of the power supplied by the BUS voltage 325, such messages may be referred to as USB-PD messages. The second device 340 determines the determined deglitch duration based on the USB-PD messages received from the coupled device. The second device 340 sets the determined deglitch duration on the first device 335 though a transmission on the I2C channel 345 or the second configuration channel 350.

In example operation, the first device 335 receives the determined deglitch duration from the second device 340 by the I2C channel 345. The first device 335 may implement the determined deglitch time and reference voltage before enabling the transistor 315. The first device 335 may disable the transistor 315 as a result of determining a physical disconnect and/or receiving a message from the second device 340 to disable the transistor 315. The first device 335 may transmit a message to the second device 340 through the I2C channel 345 or the second configuration channel 350 as a result of determining a physical disconnect. Advantageously, the devices 335 and 340 may be implemented as a separate chip within a single package.

Figure 4:
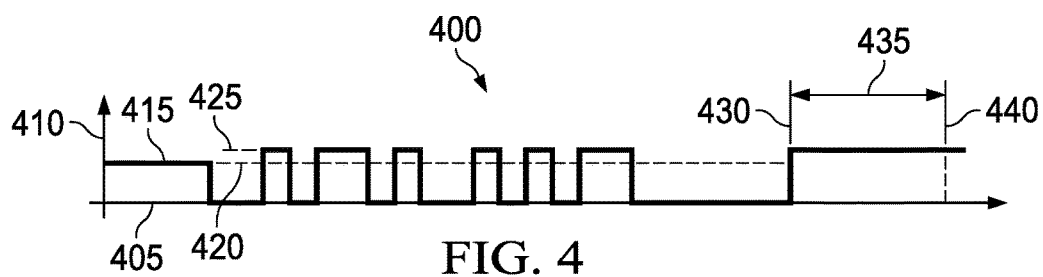
FIG. 4 is an example timing diagram of an example data transmission on a configuration channel by the sink device of FIG. 1 to the source device of FIG. 1.

FIG. 4 is an example timing diagram 400 of an example data transmission on a configuration channel (e.g., the configuration channel 116 of FIG. 1, the configuration channel 230 of FIG. 3, etc.). In the example of FIG. 4, the example timing diagram 400 includes an example time axis 405, an example voltage axis 410, an example data transmission 415, an example reference voltage 420, an example digital high voltage 425, an example physical disconnect 430, an example determined deglitch duration 435, and an example physical disconnect determined 440. In the example of FIG. 4 the timing diagram 400 represents a data transmission as seen by an example source device (e.g., the source side circuitry 108 of FIG. 1, the source device 200 of FIG. 2, etc.).

In the example of FIG. 4, the data transmission 415 may be configured to the reference voltage 420 during a state in which a source device and a sink device (e.g., the sink side circuitry 130 of FIG. 1, the sink device 300 of FIG. 3, etc.) are coupled and neither device is driving the configuration channel using a BMC (e.g., the BMC 124 or 144). The magnitude of the reference voltage 420 is configured based on the voltage difference across a pull-up resistor included in the source device (e.g., the first resistor 122 of FIG. 1) and the voltage difference across a pull-down resistor included in the sink device (e.g., the second resistor 142 of FIG. 1). The pull-up and pull-down resistors may be configured to set the configuration channel to a reference voltage between a common potential (e.g., ground) and a supply voltage.

In the example of FIG. 4, the data transmission 415 may be a digital high by setting the voltage of the configuration channel to a value represented by the digital high value 425 or may be coupled to a common potential (e.g., ground) to represent a digital low. The digital high value 425 may be configured to be the same voltage as the supply voltage. For example, a source device including a pull-up resistor coupled to the configuration channel may determine the voltage of the configuration channel to be equal to a reference voltage (e.g., a fixed voltage) as a result of a physical disconnect, such that the pull-down resistor of the sink device is removed.

A deglitch circuit (e.g., the deglitch circuits 128 and 148 of FIG. 1) is configured to determine during the data transmission 415, the physical disconnect 430 occurs after the determined deglitch duration 435 occurred. The source device determines the physical disconnect 430 occurred as a result of the configuration channel remaining at a digital high value for a duration of the determined deglitch duration 435. The sink device determines a physical disconnect based on the configuration channel remaining at a digital low value for a duration of the determined deglitch duration 435.

The source device determines the physical disconnect 430 occurred at the physical disconnect determined 440 time. The difference in time between the physical disconnect 430 and the physical disconnect determined 440 may be decreased or increased by adjusting the determined deglitch duration 435. The determined deglitch duration 435 may be configured based on the magnitude of power being transferred across a BUS voltage (e.g., the BUS voltage 114, the BUS voltage 225). Alternatively, the determined deglitch duration 435 may be configured based on the duration of a data transmission.

Figure 5:
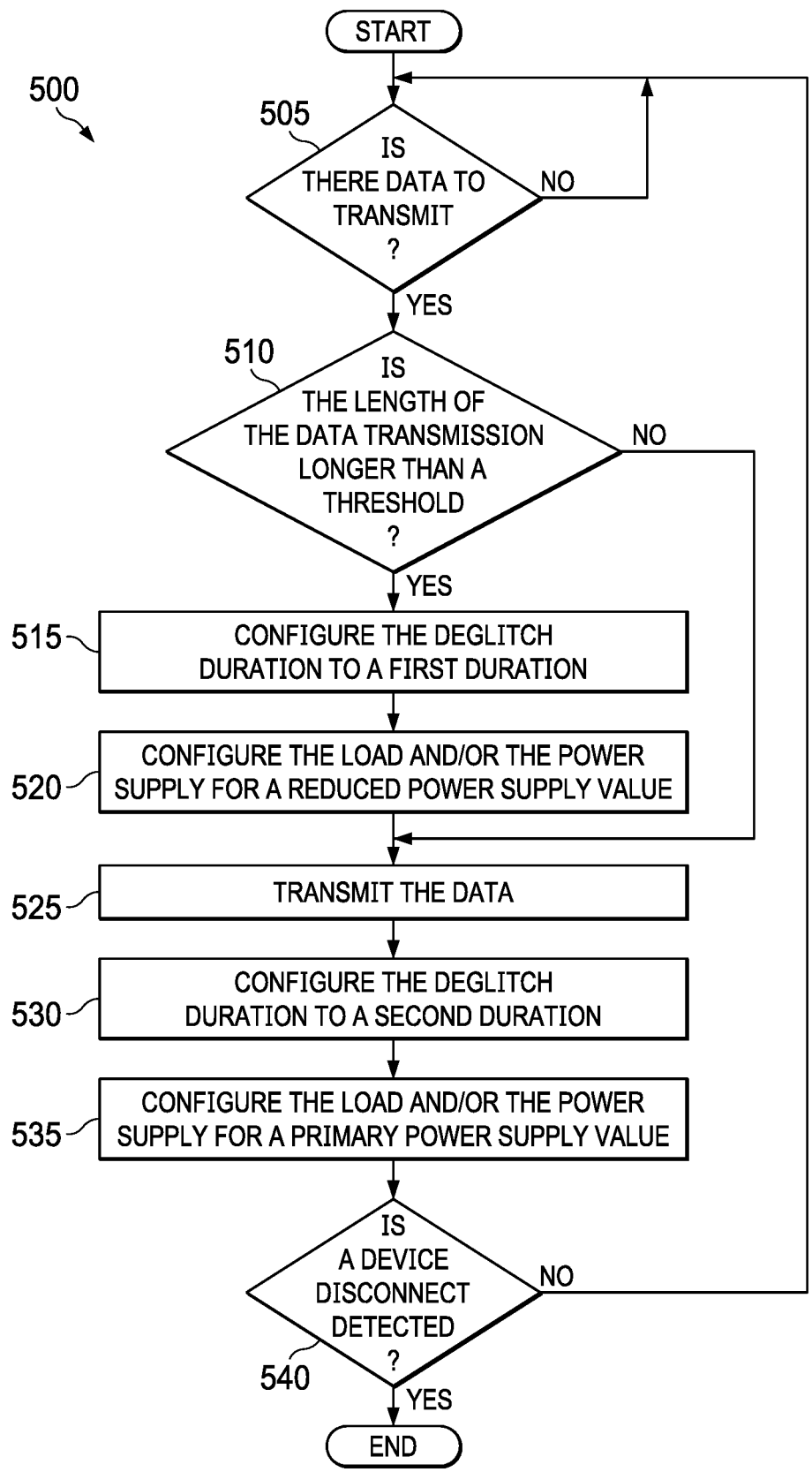
FIG. 5 is a flowchart representative of an example process that may be performed using machine readable instructions that can be executed and/or hardware configured to implement the source device of FIG. 1 and/or the sink device of FIG. 1 to accurately set a debounce duration.

FIG. 5 is a flowchart representative of an example process that may be performed using machine readable instructions that can be executed and/or hardware configured to implement the source device of FIG. 1 or 2, and/or the sink device of FIG. 1 or 3 to accurately set the determined deglitch duration 435 of FIG. 4. The machine-readable instructions 500 begin at block 505, at which the process determines if there is data to transmit. For example, the first controller 110 of FIG. 1 and/or the first BMC 124 of FIG. 1 may determine a USB-PD message to send on the configuration channel 116 of FIG. 1. At block 505, the process remains at block 505 as a result of determining there is no data to transmit. Alternatively, the process at block 505 may remain at the block 505 during data transmissions from another device.

At block 505, the controller may proceed to block 510 as a result of determining that there is data to transmit. At block 510, the controller determines if the length of the data to transmit is longer than a threshold. The threshold for the length of that data to transmit may be determined based on a determined deglitch duration (e.g., the determined deglitch duration 435 of FIG. 4). For example, if the deglitch circuits 128 and/or 148 of FIG. 1, are configured to the determined deglitch duration, the threshold of the length of the data to transmit may be set near the determined deglitch duration, such that the probability of the deglitch circuit determining a false physical disconnect event may be reduced. Alternatively, the threshold may be configured based on a magnitude of power to be transferred from one device to another across a BUS voltage (e.g., the BUS voltage 114 of FIG. 1). For example, the sink device 104 of FIG. 1 may determine that the magnitude of power to be transferred is enough to limit the length of data transmission, such that the duration between the physical disconnect and determining the physical disconnect are reduced.

At block 510, the controller may proceed to block 515 as a result of determining that the length of the data to transmit is greater than and/or equal to the threshold. At block 515 the source device and/or sink device configure the deglitch duration to a first duration. The first duration may be determined based on the magnitude of power being transferred from the source device to the sink device or the duration of the data transmission. For example, the source device 102 of FIG. 1 may decrease the duration of the deglitch duration based on determining a data transmission from the sink device 104 of FIG. 1 is of a length greater than a threshold. Alternatively, the source device and/or sink device may be configured to not alter the deglitch duration. The controller proceeds to block 520.

At block 520, the controller configures the load and/or a power supply for a reduced power supply value. The controller may limit the probability of an arc occurring by configuring the load to a decreased value and/or the power supply to a decreased voltage based on the length of the data to transmit. Once the transmission is complete, the load and/or power supply can return to the pre-transmission value. Alternatively, the controller may determine to create a plurality of data transmissions to decrease the length of the data to transmit in each transmission. For example, the length of the data to transmit may be split into a plurality of messages of lengths less than that of the threshold of the length of the data to transmit. Advantageously, the probability of an arc is decreased based on decreasing the power supplied by the power supply as a result of determining the length of data to transmit being greater than a threshold. Advantageously, the probability of an arc is decreased based on decreasing the power consumed by the load (e.g., disabling a transistor 315 or asserting a GPIO 355) as a result of determining the length of data to transmit being greater than a threshold. Advantageously, the probability of an arc is decreased based on generating a plurality of data transmissions as a result of determining the length of data to transmit being greater than a threshold. The controller proceeds to block 525.

At block 510, the controller may proceed to block 525 as a result of determining that the length of the data to transmit is less than that of the threshold. At block 525, the data to transmit is transmitted across a configuration channel (e.g., the configuration channel 116 of FIG. 1) to a device. A device may transmit data across the configuration channel by using a driver (e.g., the first BMC 124 of FIG. 1, the second BMC 144 of FIG. 1). Alternatively, a device may wait to transmit data across the configuration channel as a result of determining that another device (coupled to the configuration channel) is transmitting data. The controller proceeds to block 530.

At block 530 the source device and/or sink device configure the deglitch duration to a second duration. The second duration may be determined based on the magnitude of power being transferred from the source device to the sink device. For example, the source device 102 of FIG. 1 may increase the duration of the deglitch duration based on determining the end of its data transmission to the sink device 104 of FIG. 1. Alternatively, the source device and/or sink device may configure the deglitch duration to be equal to that of the first duration of block 515. The controller proceeds to block 535.

At block 535, the source device and/or the sink device configure the load and/or the power supply for a primary power supply value. The primary supply value is a value representing a magnitude of power supplied by the source device (e.g., the source side circuitry 108 of FIG. 1) to the load (e.g., the load 134 of FIG. 1), without any power supply restrictions. For example, the sink device 104 may increase the load by enabling a switch (e.g., the second transistor 138 of FIG. 1) or de-asserting a GPIO (e.g., the GPIO 355 of FIG. 3) as the result of determining the end of a USB-PD message transmission. The source device and/or the sink device may adjust the power supply and/or load based at the end of transmission, such that either device may determine a physical disconnect and disconnect the BUS voltage. The controller proceeds to block 540.

At block 540, the controller determines if a device disconnect is detected. For example, if the deglitch circuits 128 and/or 148 determine a physical disconnect occurred. Alternatively, the device may determine if a device disconnect is detected as a result of determining another device is transmitting data across the configuration channel. Advantageously, the device may determine a physical disconnect during a data transmission across the configuration channel based on the data transmission of another device. At block 540, the controller may proceed to block 505 as a result of determining that a device disconnect did not occur. At block 540, the controller may end as a result of determining that a device disconnect did occur. Alternatively, the controller may include a block to disable a switch (e.g., the transistors 120 and/or 138 of FIG. 1) to physically remove power from the BUS voltage.

The machine-readable instructions 500 may be configured by a plurality of USB-PD messages upon determining a device connection. For example, a plurality of USB-PD messages may be transmitted across the configuration channel to set the threshold value of block 510 based on a primary device (e.g., the source device 102 of FIG. 1) determining a physical connection to a secondary device (e.g., the sink device 104 of FIG. 1). Alternatively, the USB-PD messages may configure the magnitude of the power supply and/or magnitude of power consumed by the load as a result of determining the length of data to transmit being greater than the threshold. Advantageously, the probability of an arc is reduced as a result of the limiting the length of the data to transmit across the configuration channel.

Although example methods are described with reference to the flowchart illustrated in FIG. 5, many other methods of power reduction to prevent an arc may alternatively be used in accordance with the in accordance with this description. For example, the order of execution of the blocks may be changed, and/or some of the blocks described may be changed, eliminated, or combined. Similarly, additional operations may be included in the manufacturing process before, in between, or after the blocks shown in the illustrated examples.

Figure 6:
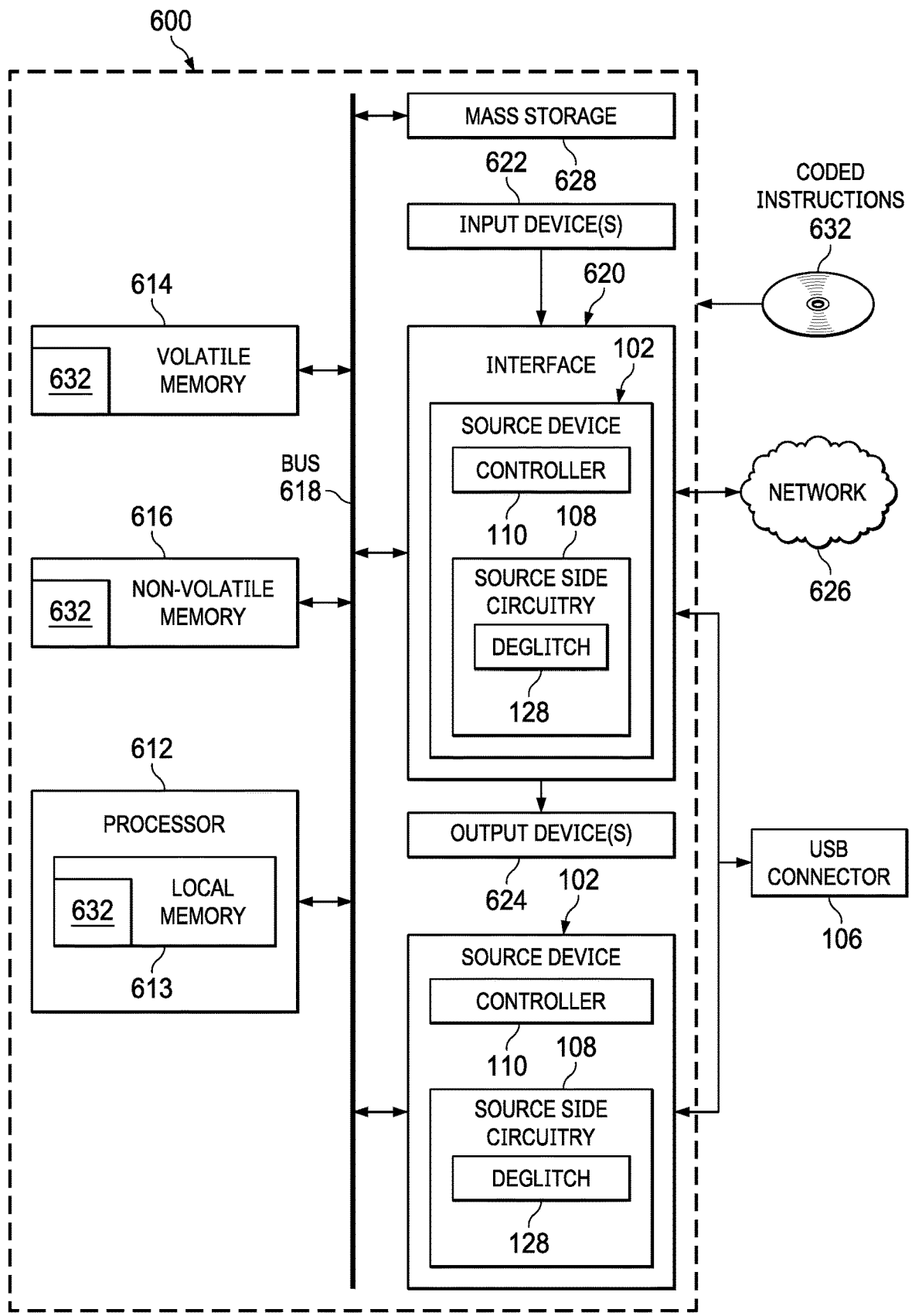
FIG. 6 is a block diagram of an example processing platform including processor circuitry structured to execute the example machine readable instructions and/or the example operations of FIG. 5 to implement the source device of the USB communication system of FIG. 1.

FIG. 6 is a block diagram of an example processor platform 600 structured to execute and/or instantiate the machine-readable instructions and/or the operations of FIG. 5 to implement the apparatus of FIG. 1. The processor platform 600 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing device.

The processor platform 600 of the illustrated example includes processor circuitry 612. The processor circuitry 612 of the illustrated example is hardware. For example, the processor circuitry 612 can be implemented by one or more integrated circuits, logic circuits, FPGAs microprocessors, CPUs, GPUs, DSPs, and/or microcontrollers from any desired family or manufacturer. The processor circuitry 612 may be implemented by one or more semiconductor based (e.g., silicon based) devices. The processor circuitry 612 may be configured to include the first controller 110 of FIG. 1.

The processor circuitry 612 of the illustrated example includes a local memory 613 (e.g., a cache, registers, etc.). The processor circuitry 612 of the illustrated example is in communication with a main memory including a volatile memory 614 and a non-volatile memory 616 by a bus 618. The volatile memory 614 may be implemented by synchronous dynamic random access memory (SDRAM), dynamic random access memory (DRAM), RAMBUS® dynamic random access memory (RDRAM®), and/or any other type of RAM device. The non-volatile memory 616 may be implemented by flash memory and/or any other desired type of memory device.

The processor platform 600 of the illustrated example also includes interface circuitry 620. The interface circuitry 620 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface. In the example of FIG. 6, the interface circuitry 620 includes that source device 102 of FIG. 1. Alternatively, the source device 102 may be coupled to the bus 618 and the USB connector 106 of FIG. 1. Alternatively, the source device 102 may be replaced with the source device 200 of FIG. 2, such that the second device 240 may be included in the processor circuitry 612 and/or the first device 235 may be controlled by the processor circuitry 612 and/or the interface 620.

In the illustrated example, one or more input devices 622 are connected to the interface circuitry 620. The input device(s) 622 permit(s) a user to enter data and/or commands into the processor circuitry 612. The input device(s) 622 can be implemented by, for example, an audio sensor, a microphone, a camera (still or video), a keyboard, a button, a mouse, a touchscreen, a track-pad, a trackball, an isopoint device, and/or a voice recognition system.

One or more output devices 624 are also connected to the interface circuitry 620 of the illustrated example. The output device(s) 624 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 620 of the illustrated example, thus, typically includes a graphics driver card, a graphics driver chip, and/or graphics processor circuitry such as a GPU.

The interface circuitry 620 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 626. The communication can be by, for example, an Ethernet connection, a digital subscriber line (DSL) connection, a telephone line connection, a coaxial cable system, a satellite system, a line-of-site wireless system, a cellular telephone system, an optical connection, etc.

The processor platform 600 of the illustrated example also includes one or more mass storage devices 628 to store software and/or data. Examples of such mass storage devices 628 include magnetic storage devices, optical storage devices, floppy disk drives, HDDs, CDs, Blu-ray disk drives, redundant array of independent disks (RAID) systems, solid state storage devices such as flash memory devices and/or SSDs, and DVD drives.

The machine executable instructions 632, which may be implemented by the machine readable instructions of FIG. 5, may be stored in the mass storage device 628, in the volatile memory 614, in the non-volatile memory 616, and/or on a removable non-transitory computer readable storage medium such as a CD or DVD.

Figure 7:
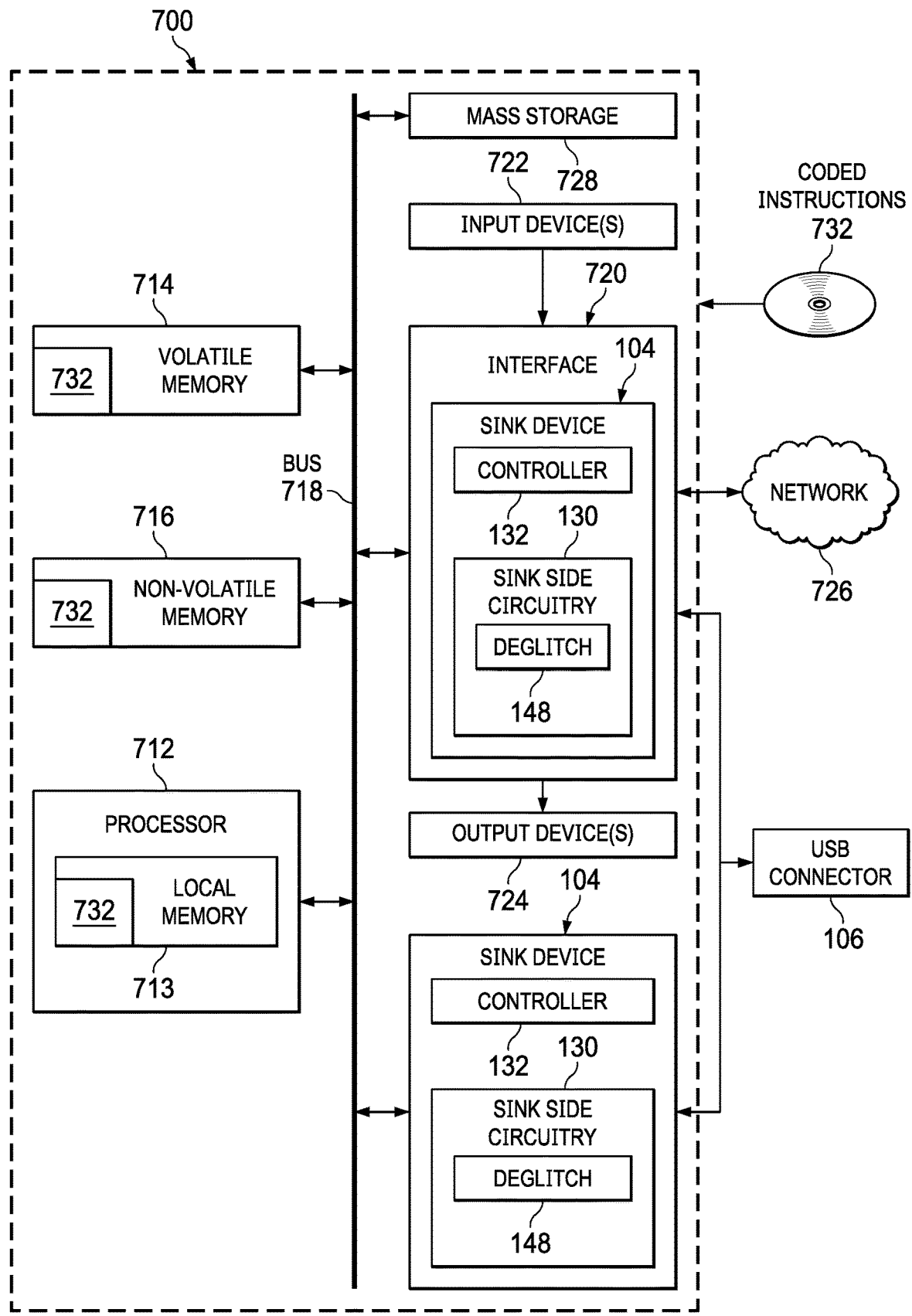
FIG. 7 is a block diagram of an example processing platform including processor circuitry structured to execute the example machine readable instructions and/or the example operations of FIG. 5 to implement the sink device of the USB communication system of FIG. 1.

FIG. 7 is a block diagram of an example processor platform 700 structured to execute and/or instantiate the machine-readable instructions and/or the operations of FIG. 5 to implement the apparatus of FIG. 1. The processor platform 700 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing device.

The processor platform 700 of the illustrated example includes processor circuitry 712. The processor circuitry 712 of the illustrated example is hardware. For example, the processor circuitry 712 can be implemented by one or more integrated circuits, logic circuits, FPGAs microprocessors, CPUs, GPUs, DSPs, and/or microcontrollers from any desired family or manufacturer. The processor circuitry 712 may be implemented by one or more semiconductor based (e.g., silicon based) devices. The processor circuitry 712 may be configured to include the second controller 132 of FIG. 1.

The processor circuitry 712 of the illustrated example includes a local memory 713 (e.g., a cache, registers, etc.). The processor circuitry 712 of the illustrated example is in communication with a main memory including a volatile memory 714 and a non-volatile memory 716 by a bus 718. The volatile memory 714 may be implemented by SDRAM, DRAM, RDRAM®, and/or any other type of RAM device. The non-volatile memory 716 may be implemented by flash memory and/or any other desired type of memory device.

The processor platform 700 of the illustrated example also includes interface circuitry 720. The interface circuitry 720 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface. In the example of FIG. 7, the interface circuitry 720 includes that sink device 104 of FIG. 1. Alternatively, the sink device 104 may be coupled to the bus 718 and the USB connector 106 of FIG. 1. Alternatively, the sink device 104 may be replaced with the sink device 300 of FIG. 3, such that the second device 340 of FIG. 3 may be included in the processor circuitry 712 and/or the first device 335 of FIG. 3 may be controlled by the processor circuitry 712 and/or the interface 720.

In the illustrated example, one or more input devices 722 are connected to the interface circuitry 720. The input device(s) 722 permit(s) a user to enter data and/or commands into the processor circuitry 712. The input device(s) 722 can be implemented by, for example, an audio sensor, a microphone, a camera (still or video), a keyboard, a button, a mouse, a touchscreen, a track-pad, a trackball, an isopoint device, and/or a voice recognition system.

One or more output devices 724 are also connected to the interface circuitry 720 of the illustrated example. The output device(s) 724 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 720 of the illustrated example, thus, typically includes a graphics driver card, a graphics driver chip, and/or graphics processor circuitry such as a GPU.

The interface circuitry 720 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 726. The communication can be by, for example, an Ethernet connection, a digital subscriber line (DSL) connection, a telephone line connection, a coaxial cable system, a satellite system, a line-of-site wireless system, a cellular telephone system, an optical connection, etc.

The processor platform 700 of the illustrated example also includes one or more mass storage devices 728 to store software and/or data. Examples of such mass storage devices 728 include magnetic storage devices, optical storage devices, floppy disk drives, HDDs, CDs, Blu-ray disk drives, redundant array of independent disks (RAID) systems, solid state storage devices such as flash memory devices and/or SSDs, and DVD drives.

The machine executable instructions 732, which may be implemented by the machine readable instructions of FIG. 5, may be stored in the mass storage device 728, in the volatile memory 714, in the non-volatile memory 716, and/or on a removable non-transitory computer readable storage medium such as a CD or DVD.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead. For example, a p-channel field effect transistor ("PFET") may be used in place of an n-channel field effect transistor ("NFET") with little or no changes to the circuit. Furthermore, other types of transistors may be used (such as bipolar junction transistors ("BJTs")).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value.

Modifications are possible in the described embodiments, and other embodiments are possible, within the scope of the claims.

What is claimed is:

1. An apparatus comprising:
a switch having a first current terminal, a second current terminal and a control terminal, the first current terminal adapted to be coupled to a first capacitor, the second current terminal adapted to be coupled to a second capacitor;
a comparator having a first comparator input, a second comparator input, and a comparator output, the first comparator input coupled to a configuration terminal;

a deglitch circuit having a deglitch input and a deglitch output, the deglitch input coupled to the comparator output; and a controller having a first controller output, a second controller output, and a controller input, the first controller output coupled to the control terminal, the second controller output coupled to the second comparator input, and the controller input coupled to the deglitch output.

2. The apparatus of claim 1, wherein the apparatus further includes a variable power supply coupled in parallel with the first capacitor.

3. The apparatus of claim 1, wherein the switch is an n-channel field effect transistor (NFET) including a gate terminal and wherein the gate terminal is the control terminal.

4. The apparatus of claim 1, wherein the first comparator input is coupled to a reference voltage, and the reference voltage is configured to enable the comparator to determine a value of the first comparator input.

5. The apparatus of claim 1, wherein the apparatus further includes a driver coupled to the first comparator input, the driver configured to set and/or clear the first comparator input to transmit data.

6. The apparatus of claim 5, wherein the driver is a baseband management controller (BMC), and the BMC is configured to receive and transmit data on the first comparator input.

7. The apparatus of claim 1, wherein the apparatus further includes a load coupled in parallel to the first capacitor.

8. The apparatus of claim 1, wherein the deglitch circuit has a deglitch duration between a first duration and a second duration, and the controller is configured to determine whether deglitch duration is the first duration or the second duration, and the controller is configured to set the deglitch duration.

9. A method comprising:
receiving, by circuitry, data at a configuration terminal of a bus;
monitoring, by the circuitry, a signal at the configuration terminal of the bus;
comparing, by the circuitry, the signal at the configuration terminal to a reference voltage to produce a comparison signal;
determining, by the circuitry, a device disconnect based the comparison signal have a value for more than a deglitch duration;
producing, by the circuitry, a control signal based on determining the device disconnect; and
transmitting a data transmission across a configuration channel based on a controller driving the configuration terminal.

10. The method of claim 9, further comprising:
reducing power in a device by disabling a switch in response to the control signal; and
supplying power from a power supply through the switch, and the switch reduces the power supplied by the power supply as a result of being disabled.

11. The method of claim 9, further comprising determining the deglitch duration based on a duration of the data transmission.

12. The method of claim 9, further comprising:
reducing power in a device by disabling a switch in response to the control signal; and
receiving power from a power supply through the switch, and the switch reducing the power received by the device as a result of being disabled.

13. The method of claim 9, further comprising:
reducing power in a device by disabling a switch in response to the control signal; and
determining the deglitch duration based on a magnitude of power being supplied through the switch.

14. The method of claim 13, further comprising reducing the deglitch duration based on the magnitude of power being greater than a threshold.

15. The method of claim 9, further comprising:
reducing power in a device by disabling a switch in response to the control signal; and
enabling the switch based on a duration of a data transmission compared to a threshold.

16. The method of claim 9, further comprising a general-purpose input output (GPIO) pin, and asserting the GPIO pin to reduce power consumed by a device.

17. The method of claim 16, further comprising asserting the GPIO pin during a data transmission on the configuration terminal as a result of a length of the data transmission being determined to be greater than a threshold.

18. A system comprising:
a device including a controller, the controller configured to:
supply power of a first supply value to a load based on a magnitude of power supplied by a power supply;
responsive to determining the first supply value is greater than a first threshold, determine a length of a data transmission;
responsive to determining the length of the data transmission is greater than a second threshold, configure the load for a second supply value; and
transmit the data transmission.

19. The system of claim 18, wherein the device is configured to disable a switch as a result of determining a device disconnect based on comparing a voltage of a configuration channel to a reference voltage.

20. The system of claim 18, wherein the device is configured to modify the load to adjust for the first supply value after the data transmission.

21. The system of claim 18, wherein the device is configured to modify the load by asserting or de-asserting a general-purpose input output pin to adjust a load current.

* * * * *